United States Patent
Petrov et al.

(10) Patent No.: US 7,113,760 B1
(45) Date of Patent: Sep. 26, 2006

(54) DIRECT CONVERSION RECEIVER FOR AMPLITUDE MODULATED SIGNALS USING LINEAR/LOG FILTERING

(75) Inventors: Andrei R. Petrov, Pocatello, ID (US); Shane A. Blanchard, Chubbuck, ID (US)

(73) Assignee: AMI Semiconductor, Inc., Pocatello, ID (US)

( * ) Notice: Subject to any disclaimer, the term of this patent is extended or adjusted under 35 U.S.C. 154(b) by 436 days.

(21) Appl. No.: 10/426,383

(22) Filed: Apr. 29, 2003

(51) Int. Cl.
*H04B 1/26* (2006.01)

(52) U.S. Cl. .................... 455/324; 455/209; 455/258; 455/315; 455/339

(58) Field of Classification Search ............... 455/207, 455/209, 314, 132, 137, 208, 205, 255, 257, 455/258, 313–315, 323, 324, 338, 339
See application file for complete search history.

(56) References Cited

U.S. PATENT DOCUMENTS

| | | | |
|---|---|---|---|
| 3,961,262 A * | 6/1976 | Gassmann ................ 455/207 |
| 4,276,513 A | 6/1981 | Johnston et al. ............ 330/9 |
| 4,599,743 A | 7/1986 | Reed ..................... 455/207 |
| 4,736,390 A | 4/1988 | Ward et al. ................ 375/75 |
| 4,814,715 A | 3/1989 | Kasperkovitz ............. 329/50 |
| 4,942,365 A | 7/1990 | Satterwhite .............. 328/134 |
| 5,086,437 A | 2/1992 | Tomita .................... 375/98 |
| 5,241,702 A | 8/1993 | Dent .................... 455/278.1 |
| 5,263,194 A | 11/1993 | Ragan ................... 455/316 |
| 5,442,655 A | 8/1995 | Dedic et al. ............. 375/340 |
| 5,461,646 A | 10/1995 | Anvari ................... 375/347 |
| 5,530,926 A | 6/1996 | Rozanski ............... 455/277.2 |
| 5,561,673 A | 10/1996 | Takai et al. .............. 371/5.5 |
| 5,617,060 A | 4/1997 | Wilson et al. ............ 330/129 |
| 5,634,204 A | 5/1997 | Takahashi et al. ......... 455/134 |
| 5,692,019 A | 11/1997 | Chang et al. ............. 375/347 |
| 5,740,530 A | 4/1998 | Labedz et al. ............ 455/403 |
| 5,818,543 A | 10/1998 | Lee ...................... 348/725 |
| 5,870,480 A * | 2/1999 | Griesinger ................ 381/18 |
| 5,889,826 A | 3/1999 | Takahashi ............... 315/347 |
| 5,953,640 A | 9/1999 | Meador et al. ............ 455/73 |
| 6,002,672 A | 12/1999 | Todd .................... 370/252 |
| 6,009,307 A | 12/1999 | Granata et al. .......... 455/13.3 |
| 6,018,647 A | 1/2000 | Fitzgerald ............... 455/135 |

(Continued)

OTHER PUBLICATIONS

C. Menolfi and Q. Huang, "A Low-Noise CMOS Instumentation Amplifier for Thermoelectric Infrared Detectors", IEEE J. Solid-State Circuits, vol. 32, No. 7, pp. 968-976, Jul. 1997.

(Continued)

*Primary Examiner*—Edward F. Urban
*Assistant Examiner*—Nhan T. Le
(74) *Attorney, Agent, or Firm*—Workman Nydegger (57) ABSTRACT

A receiver circuit that includes a direct conversion receiver that receives a modulated signal, and generates an in-phase differential signal and a quadrature-phase differential signal. The receiver circuit includes an in-phase branch that processes the in-phase differential signal, and a quadrature-phase branch that processes the quadrature-phase differential signal. Each branch includes an amplifier and a summer. The amplifier is configured to receive and amplify the respective in-phase or quadrature-phase differential signal. The summer receives the resulting amplified differential signal and sums the signals to generate a single signal. A log amplifier receives the summed in-phase and quadrature-phase signal, and generates an RSSI signal that is proportional to the log of the difference between the two summed signals. The data may then be extracted based on the amplitude of the RSSI signal.

14 Claims, 7 Drawing Sheets

U.S. PATENT DOCUMENTS

| | | | |
|---|---|---|---|
| 6,023,615 A | 2/2000 | Bruckert et al. | 455/277.2 |
| 6,029,058 A | 2/2000 | Namgoong et al. | 455/324 |
| 6,085,076 A | 7/2000 | Lindsay et al. | 455/277.1 |
| 6,148,184 A * | 11/2000 | Manku et al. | 455/110 |
| 6,172,970 B1 | 1/2001 | Ling et al. | 370/347 |
| 6,175,728 B1 | 1/2001 | Mitama | 455/323 |
| 6,188,880 B1 | 2/2001 | Sanielevici | 455/296 |
| 6,192,225 B1 | 2/2001 | Arpaia et al. | 455/196.1 |
| 6,212,244 B1 | 4/2001 | Davidovici et al. | 375/345 |
| 6,225,848 B1 | 5/2001 | Tilley et al. | 327/307 |
| 6,246,867 B1 | 6/2001 | Jakobsson | 455/324 |
| 6,249,249 B1 | 6/2001 | Obayashi et al. | 342/371 |
| 6,275,542 B1 | 8/2001 | Katayama et al. | 375/322 |
| 6,327,313 B1 | 12/2001 | Traylor et al. | 375/316 |
| 6,330,433 B1 | 12/2001 | Jager | 455/277.2 |
| 2003/0143967 A1* | 7/2003 | Ciccarelli et al. | 455/232.1 |
| 2003/0203743 A1* | 10/2003 | Sugar et al. | 455/550.1 |
| 2004/0038649 A1* | 2/2004 | Lin et al. | 455/130 |
| 2004/0116096 A1* | 6/2004 | Shen | 455/323 |
| 2004/0161030 A1* | 8/2004 | Mohindra et al. | 375/235 |
| 2004/0171365 A1* | 9/2004 | Godambe et al. | 455/232.1 |
| 2004/0190647 A1* | 9/2004 | Malone et al. | 375/322 |

OTHER PUBLICATIONS

C.C.Enz, E.A. Vittoz, and F. Krummenacher, 'A CMOS Chopper Amplifier', IEEE J. Solid-State Circuits, vol. SC-22, No. 3, pp. 335-342, Jul. 1987.

D.K. Weaver, Jr., "Third Method of Generation and Detection of Single-Sideband Signals", Proc. IRE, pp. 1703-1705, Jun. 1956.

* cited by examiner

DIRECT CONVERSION RECEIVER FOR AMPLITUDE MODULATED SIGNALS USING LINEAR/LOG FILTERING

BACKGROUND OF THE INVENTION

1. The Field of the Invention

The present invention relates to analog integrated circuit design, and more particularly, to a direct conversion receiver that detects amplitude modulated signals using linear to log filtering.

2. Background and Related Art

Electrical signals have proven to be an effective means of conveying data from one location to another. The further a signal is transmitted, however, the greater the decay in the signal and the greater the chance for irreversible loss in the data represented by the signal. In order to guard against this signal decay, the core electrical signal that represents the data (i.e., the baseband signal) may be modulated or superimposed on a carrier wave in the Radio Frequency (RF) frequency spectrum.

In order to properly interpret the signal, conventional RF receivers extracts the baseband signal from the received signal. The data represented by the extracted baseband signal may then be interpreted by other downstream circuitry. In order to perform this extraction, typical receivers include circuitry which first converts the received radio frequency modulated signal into an intermediate frequency ("IF") signal. This intermediate frequency signal is then converted into the baseband signal for further data processing. Receiver architectures that convert through the intermediate frequency are often called "heterodyne" receiver architectures. Naturally, circuit elements (called "IF components") are required in order to deal with the intermediate conversion to and from the intermediate frequency.

It is desirable to reduce the cost, size, and power consumption of a particular receiver architecture design for strategic marketing of the receiver. This is particularly true of wireless RF receivers since those receivers are often portable and run on battery power.

One technology developed in order to reduce RF receiver cost, size, and power consumption is called "direct conversion." Direct conversion refers to the direct conversion of RF modulated signals into corresponding baseband signals without requiring conversion through the intermediate frequency. Such direct conversion receiver architectures are often called "zero-IF," "synchrodyne," or "homodyne" receiver architectures.

Figure 6:
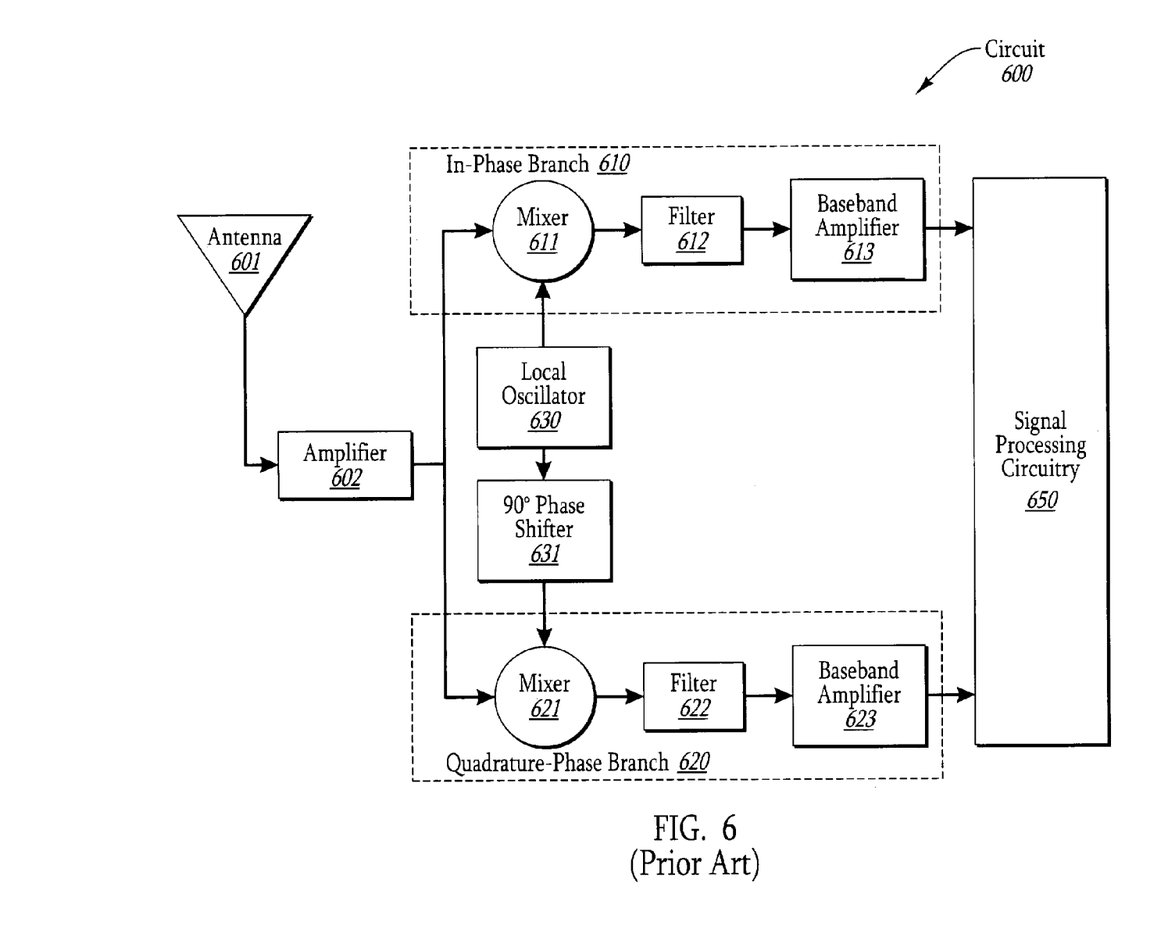
FIG. 6 illustrates a high-level circuit schematic of a direct conversion circuit in accordance with the prior art.

FIG. 6 illustrates a conventional direct conversion circuit 600 in accordance with the prior art. The circuit 600 includes an antenna 601 which receives the RF modulated signal. The antenna 601 then provides the received signal to an amplifier 602 which amplifies the signal for further processing. The amplifier 602 may be, for example, an RF low noise amplifier.

The amplified signal is then split into two branches, an "in-phase" branch 610, and a "quadrature-phase" branch 620. Each branch includes a mixer that initially receives the amplified signal. For instance, the in-phase branch 610 includes an in-phase mixer 611, and the quadrature-phase branch 620 includes a quadrature-phase mixer 621. A local oscillator 630 provides a sine or square wave signal as a control signal to each of the mixers. Each mixer is configured to nonlinearly process the amplified signal and control signal, resulting in output signal components at frequencies equal to the sum and difference of amplified signal and control signal frequencies, plus higher-order components at other frequencies. The circuit includes a 90-degree phase shifter 631 which causes the control signal for the quadrature-phase mixer 621 to be 90 degrees out of phase with the control signal for the in-phase mixer 611.

The signal from the in-phase mixer 611 is then passed through a low pass filter 612 to a baseband amplifier 613 to complete the extraction of the baseband (difference frequency) signal from the received signal as far as the in-phase branch 610 is concerned. Likewise, the signal from the quadrature-phase mixer 621 is passed through a low pass filter 622 to a baseband amplifier 623 to complete the extraction of the baseband (difference frequency) signal as far as the quadrature-phase branch is concerned. The quadrature baseband signals are then processed by signal processing circuitry 650.

The direct conversion circuit of FIG. 6 does not convert through an intermediate frequency and thus there are no IF components needed to deal with an intermediate conversion. Consequently, the direct conversion circuit of FIG. 6 is smaller, and requires less power than conventional heterodyne receiver architectures. Furthermore, the direct conversion circuit does not have to deal with image suppression as much as do heterodyne receivers. Accordingly, direct conversion receivers have many advantages over heterodyne receiver architectures.

Some important design parameters for direct conversion receivers are dynamic range, sensitivity, and power consumption. Dynamic range is the ratio of amplitude of the largest detectable signal to the amplitude of the smallest detectable signal. A larger dynamic range is considered better for receivers. Sensitivity is the smallest detectable signal at a given signal-to-noise ratio. Power is a key design criteria since direct conversion receivers are often implemented in a mobile device which typically operates on limited battery power.

Accordingly, what are desired are direct conversion receivers that have high dynamic range, high sensitivity, and low power consumption.

BRIEF SUMMARY OF THE INVENTION

The foregoing problems with the prior state of the art are overcome by the principles of the present invention, which are directed towards a receiver that detects an amplitude of a baseband signal in a manner that preserves dynamic range and power. The receiver circuit includes a direct conversion receiver that receives a modulated signal, and generates an in-phase differential signal and a quadrature-phase differential signal. The receiver includes an in-phase branch that processes the in-phase differential signal, and a quadrature-phase branch that processes the quadrature-phase differential signal.

Each branch includes an amplifier and shares a summer. The amplifier is configured to receive and amplify the respective in-phase or quadrature-phase differential signal. The shared summer receives the resulting amplified differential signal and sums the signals to generate a single differential signal.

The summed in-phase signal and quadrature-phase signal are then provided to a bandpass filter that filters out-of-band components. The filtered and summed in-phase and quadrature-phase signals are then provided to a log amplifier, which is configured to generate a signal that is approximately proportional to a log of the amplitude of the two summed signals. The output signal of the log amplifier may be the equivalent of a Receive Signal Strength Indicator (RSSI).

The data may then be extracted at any given time based on the RSSI signal, the data being dependent upon the amplitude of the RSSI signal.

In one embodiment, the direct conversion receive also includes an in-phase branch and a quadrature phase branch, each branch not only including a down-converting mixer and low pass filter, but also including an up-converting mixer that converts the baseband signal to some intermediate frequency. By having the down-converting mixer, and the low pass filter prior to the up-converting mixer be passive elements, and by having active elements operate on the baseband signal only after it has been up-converted, DC offset and 1/f noise that is characteristic of direct conversion receivers may be reduced. This up-conversion also facilitates the use of the log amplifier in detecting amplitude.

The use of a log amplifier consumes less power that would an Analog to Digital converter while supporting a high dynamic range. Accordingly, the circuit in accordance with the present invention consumes low power while retaining suitable dynamic range.

In one embodiment, a diversity receiver system is implemented in which the above-described structure is copied twice, once for each antenna. The RSSI signal for each of the two log amplifiers is then summed and passed through a low pass filter. That filtered and summed RSSI signal may then be used to extract the data, the data being dependent upon the level of the filtered and summed RSSI signal.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The principles of the present invention are directed towards a receiver that detects an amplitude of a baseband signal in a manner that preserves dynamic range and power. The receiver circuit includes a direct conversion receiver that receives a modulated signal, and generates an in-phase differential signal and a quadrature-phase differential signal. The receiver includes an in-phase branch that processes the in-phase differential signal, and a quadrature-phase branch that processes the quadrature-phase differential signal. Each branch includes an amplifier and a shared summer. The amplifier is configured to receive and amplify the respective in-phase or quadrature-phase differential signal. The summer receives the resulting amplified differential signal and sums the signals to generate a single signal. A bandpass filter receives the summed signals and filters out of band components. A log amplifier receives the filtered and summed in-phase and quadrature-phase signals, and generates a signal that is proportional to the log of the difference between the two summed signals.

In this description and in the claims, one node in a circuit is "coupled" to another node in the circuit if charge carriers freely flow (even through some devices and/or with some resistance) between the two nodes during normal operation of the circuit. One node in a circuit is "capacitively coupled" to another node in the circuit if there are one or more capacitors that intervene between the two nodes. One node in a circuit is "at least capacitively coupled" to another node if the two nodes are either coupled together as just defined, or are capacitive coupled together as just defined.

In this description and in the claims, a signal being "down-converted" means that the signal is operated upon such that its frequency spectrum tends more towards lower frequencies as compared to before the operation, the operation occurring without any loss in the core data represented by the signal. A signal being "up-converted" means that the signal is operated upon such that its frequency spectrum tends more towards higher frequencies as compared to before the operation, the operation also occurring without any loss in the core data represented by the signal.

Figure 1:
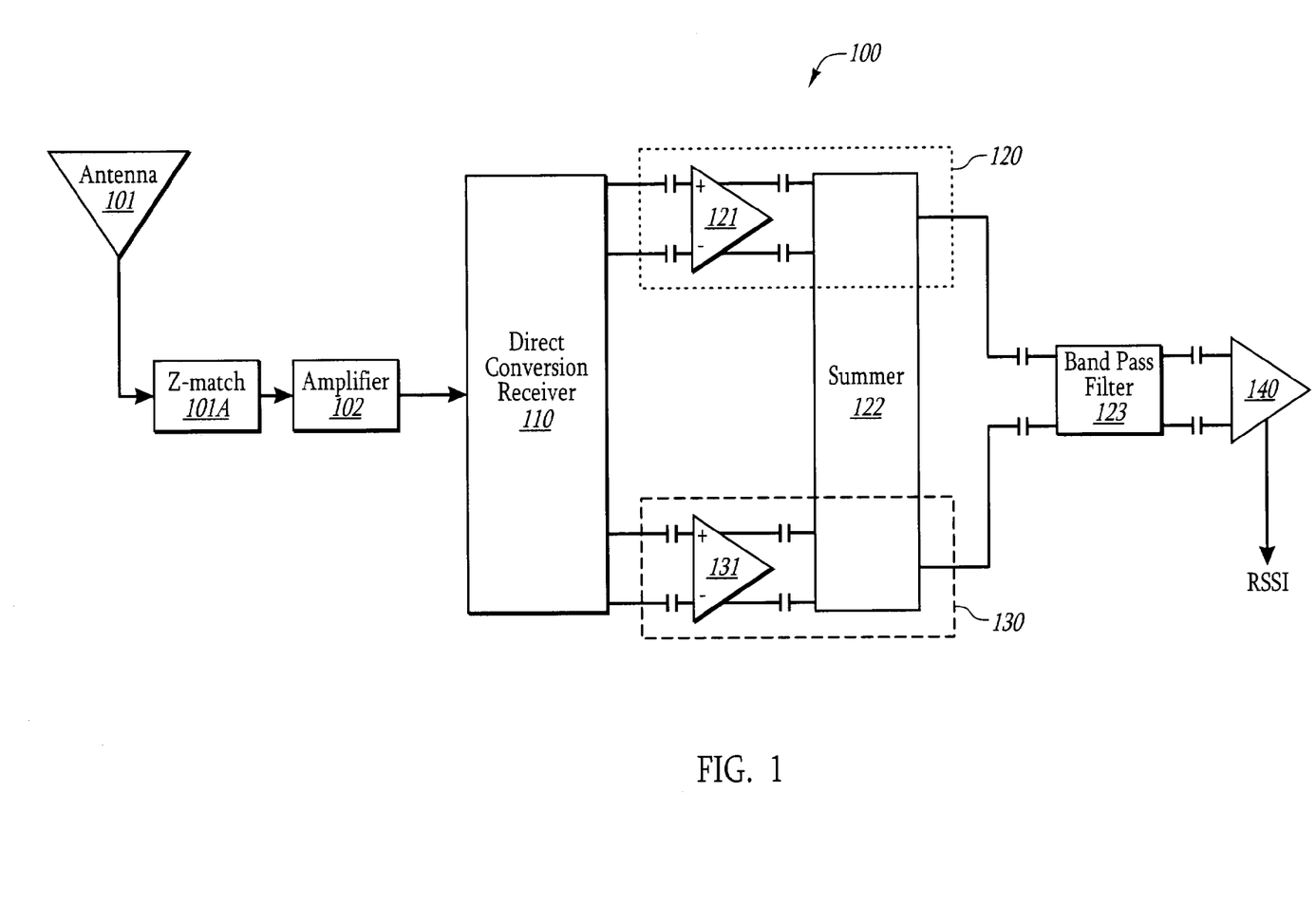
FIG. 1 illustrates a schematic diagram of a receiver circuit that detects baseband amplitude in accordance with the principles of the present invention.

FIG. 1 illustrates a receiver circuit 100 in accordance with the principles of the present invention. The receiver circuit 100 includes an antenna 101 which converts a signal over-the-air to a signal on the wire. However, the receiver circuit may operate even when the signal is received over a physically channeled conduit such as a wire, in which case there would be no need for antenna 101.

An amplifier 102 amplifies the received signal so as to generate a signal of sufficient magnitude upon which to perform subsequent operations. An impedance matching circuit 101A operates to match the impedance of the antenna and the input impedance of the amplifier 102 so as to improve admittance of the signal from the antenna 101 to the remaining circuitry. Such impedance matching reduces reflectance of the signal and improves power transfer as is known to those or ordinary skill in the art. The amplifier 102 may be a low noise amplifier of the type commonly used to amplify a received signal in direct conversion receiver circuits.

The amplified signal from the amplifier 102 is then provided to a direct conversion receiver circuit 110, which performs direct conversion of the amplified signal. The direct conversion receiver circuit generates an in-phase differential signal that is provided to an in-phase branch 120 of the receiver circuitry, and generates a quadrature-phase differential signal that is provided to a quadrature-phase branch 130 of the receiver circuitry. The terms "in-phase" is used not to represent that the signal in the branch is "in-phase", but only to represent that the signal in the in-phase branch 120 after the in-phase down-converting mixer is approximately orthogonal to the signal in the quadrature-phase branch 130 after the quadrature-phase down-converting mixer.

The in-phase differential signal is provided as input signals to a differential amplifier 121. The differential output from the differential amplifier 121 is provided as input signals to a summer 122 that is shared with the quadrature-phase branch 130. The shared summer 122 adds the two signals together and provides the resulting summed in-phase and quadrature-phase signal through a band pass filter 123 as one input signal to a log amplifier 140.

The quadrature-phase differential signal is provided as input signals to a differential amplifier 131. The differential output from the differential amplifier 131 is provided as input signals to the summer 122. Summer 122 adds the two signals together and provides the resulting summed in-phase and quadrature-phase signal through a band pass filter 123 as the other input signal to the log amplifier 140.

The in-phase differential signals and the quadrature-phase differential signals are summed in order to suppress an unwanted side lobe that is generated during up-conversion. During up-conversion, a side lobe is introduced into the up-converted signal. The in-phase side lobe has a frequency that is below the intermediate frequency of the up-converting mixer as much as the frequency of the in-phase wanted signal is above the intermediate frequency. The polarity of the in-phase side lobe is the same polarity as the in-phase wanted signal. The quadrature-phase side lobe has a frequency that is the same as the frequency of the in-phase side lobe. However, the polarity of the quadrature-phase side lobe has a polarity that is opposite the polarity of the in-phase side lobe. Accordingly, adding the in-phase differential signal and the quadrature-phase differential signal results in a substantial reduction of the unwanted side lobe.

If the in-phase differential signal and quadrature-phase differential signal provided by the direct conversion receiver 110 has a sufficiently frequency spectrum of sufficiently high frequency, then the coupling between the direct conversion receiver 110 and the amplifier 121, between the amplifier 121 and the summer 122, and between the summer 122 and the log amplifier 140 may be a capacitive coupling as illustrated. Similarly, the coupling between the direct conversion receiver 110 and the amplifier 131, between the amplifier 131 and the summer 132, and between the summer 132 and the log amplifier 140 may also be a capacitive coupling as illustrated. Such capacitive coupling has the general effect of reducing DC offset and drift.

Figure 2:
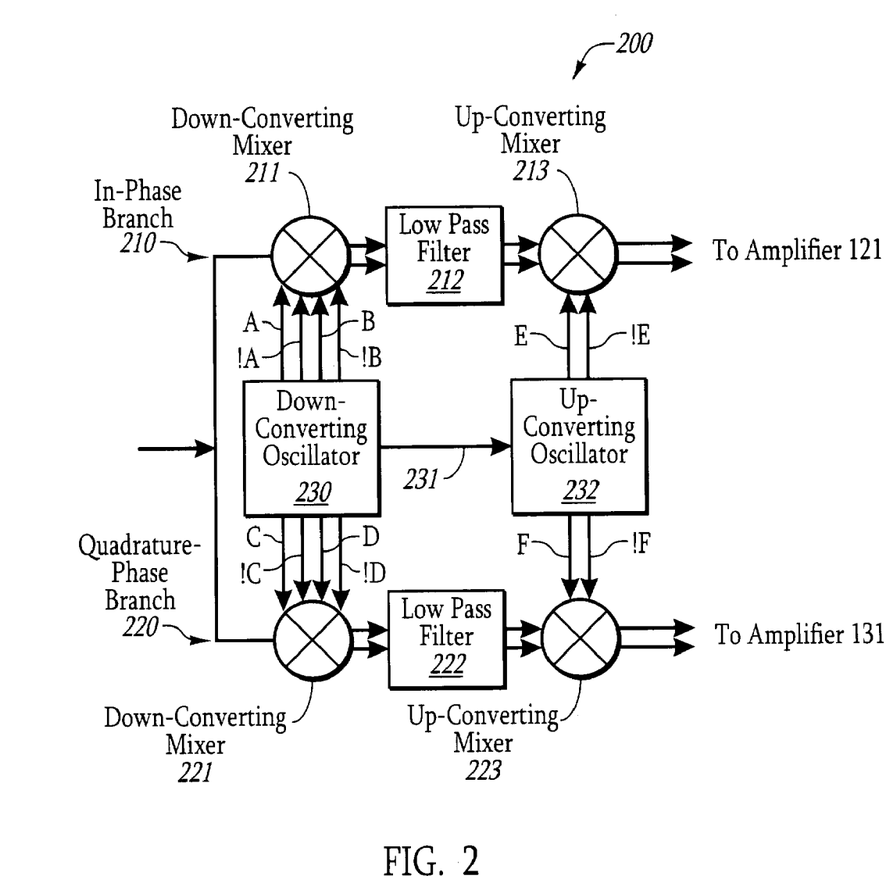
FIG. 2 illustrates an example of a direct conversion circuit that may be used as the direct conversion circuit of FIG. 1 and that uses an up-converting mixer.

FIG. 2 illustrates an example direct conversion receiver circuit 200 that may be used as the direct conversion receiver circuit 110 of FIG. 1. The amplified signal from the amplifier 102 (see FIG. 1) is provided to an in-phase branch 210, and to a quadrature phase branch 220. For example, signals that are passed through the in-phase branch 210 are first provided to a down-converting single input to differential output mixer 211, which down-converts the signal to thereby extract the baseband signal. A down-converting oscillator 230 provides control signals A, B, !A and !B. Control signals A and B each having a duty cycle of approximately twenty-five percent and are approximately 180 degrees out of phase with each other. Control signals !A and !B are the binary complement of control signals A and B, respectively.

These control signals may be cycled at approximately the frequency of the carrier frequency of the received signal. However, to achieve a substantial reduction in DC offset resulting from the self-mixing product of the mixers 211 and 221 at their output terminals, the mixer control signals A, B, !A and !B are operated at a twenty-five percent duty cycle at the frequency of the received signal. Furthermore, control signals A and B (and !A and !B) shift 180 degrees relative to each other. Thus results in the leakage combination being a square wave at twice the frequency of the received signal. This reduction in DC offset stems from the fact that even if the control signals were to irradiate back to the antenna (and thus introduce feedback into the mixer), the leakage component would be twice the carrier frequency of the modulation frequency of the signal, thereby resulting in very little DC component in the self-mixing product.

Additionally, the mixer 211 has a differential output which results in a reduction of second-order intermodulation product (also often referred to as "IP2"). The second-order intermodulation product is a product of a squaring function. Accordingly, the polarity of the second-order intermodulation product will be the same for each of the differential outputs of the mixer 211. Accordingly, the second-order intermodulation product manifests itself as a common mode signal at the differential output terminals of the mixer 211. The common mode rejection capability of subsequent circuitry that operates on the signal will thus reduce the effect of the second-order intermodulation product.

The signal output from the mixer 211 will not only include the baseband signal having the data of interest, but will also include higher frequency components that do not contain the desired data. Accordingly, the output signals from the mixer 211 are passed through a low pass filter 212 to remove the higher frequency components including all out of band signals and noise as well as the potential secondary image created by the up-converting mixer 213. The output from the low pass filter 212 will thus include only the baseband signal having the data of interest. This low pass filter 212 may be a passive element such as a Resistor-Capacitor (RC) filtering circuit. The low pass filter 212 should have a cutoff frequency that provides sufficient channel selectivity of the baseband signal. This may be accomplished using a four pole low pass filter composed of four RC low pass filters cascaded in series. By so doing, a roll-off of 80 decibels per decade may be accomplished. The use of a passive low pass filter allows for reduced or even eliminated DC offset since such passive elements do not generate the same 1/f noise that active elements do. Also, the use of the passive filter does not significantly reduce dynamic range in the way that an active filter would. The passive components of low pass filter 212 assures that there will not be any consequential degradation of the desired signal by flicker noise and that only a small amount of white noise is added.

Typically, in conventional direct conversion receiver circuits, the baseband signal itself is processed by active elements (such as high sensitivity amplifiers) in downstream circuitry. However, such active elements introduce significant 1/f noise since the baseband signal has a frequency spectrum tending towards lower frequencies. "1/f noise" refers to an effect whereby active elements introduce more noise when operating on lower frequencies, than they do on higher frequencies. Such an effect is common in any active elements. In accordance with the principles of the present invention, active elements do not operate upon the baseband signal itself, but on an up-converted version of the baseband signal. Accordingly, the noise introduced by the active element on the up-converted version of the baseband signal is much lower thereby preserving the dynamic range of the direct conversion receiver as a whole.

Specifically, the filtered baseband signal output by the low pass filter 212, is passed to an up-converting mixer 213 controlled by control signals E and !E provided by an up-converting oscillator 232. The control signals E and !E have a duty cycle of approximately 50% (or 25%) and are 180 degrees out of phase with each other. Additionally, the cycle frequency of the control signals E and !E is equal to the cycle frequency of the control signals A, B, !A and !B divided by some positive integer greater than one. In order to accomplish this, the down-converting oscillator 230 and the up-converting oscillator 232 may be interconnected as illustrated by arrow 231 so to enforce this frequency division relationship. This may be accomplished using conventional frequency division circuitry. Accordingly, the mixer 213 outputs an up-converted version of the baseband signal, which has a frequency spectrum tending towards higher frequencies than does the baseband signal itself. The frequency of the mixer 213 may be chosen in conjunction with the low pass filter 212 cutoff frequency to provide a desired level of image suppression from input signals spaced at integer multiples of the lower frequency of the mixer 213 from the baseband output of the mixer 211. Thus, the modifications of the direct conversion architecture not only provide reduction in DC offset and 1/f noise, but also retain the benefit of image suppression characteristic of direct convention receiver circuits. Amplification may be performed on the intermediate frequency signal output by the up-converted mixer 213 without the flicker noise of the amplifier introducing consequential degradation into the signal.

The downstream circuitry that includes active elements then operates directly on this higher frequency version of the baseband signal. Accordingly, the active components, such as amplifier 121, summer 122 and log amplifier 140 do not introduce as much 1/f noise. Furthermore, the subsequent circuitry may be interconnected via intervening capacitors since a higher frequency signal is being processed. This reduces and potentially even eliminates the impact of any DC offset or drift introduced by the active components as well.

The quadrature-phase branch 220 is similar to the in-phase branch 210 in that the down-converting mixer 223, control signal C, control signal D, control signal !C, control signal !D, low pass filter 222, up-converting mixer 223, control signal F, and control signal !F may have the same structure and interconnections as described above for their respective elements in the in-phase branch. However, the control signals C, D, !C, !D, F and !F will be 90 degrees out of phase with respective signals A, B, !A, !B, E and !E.

The use of a quadrature-phase branch 220 is helpful in that it allows the receiving cycle to be asynchronous with the modulation cycle. However, in the event that the in-phase branch 210 is synchronized with the modulation cycle of the received signal without the use of the quadrature-phase branch 220, the quadrature-phase branch 220 would not strictly be necessary.

Figure 3A:
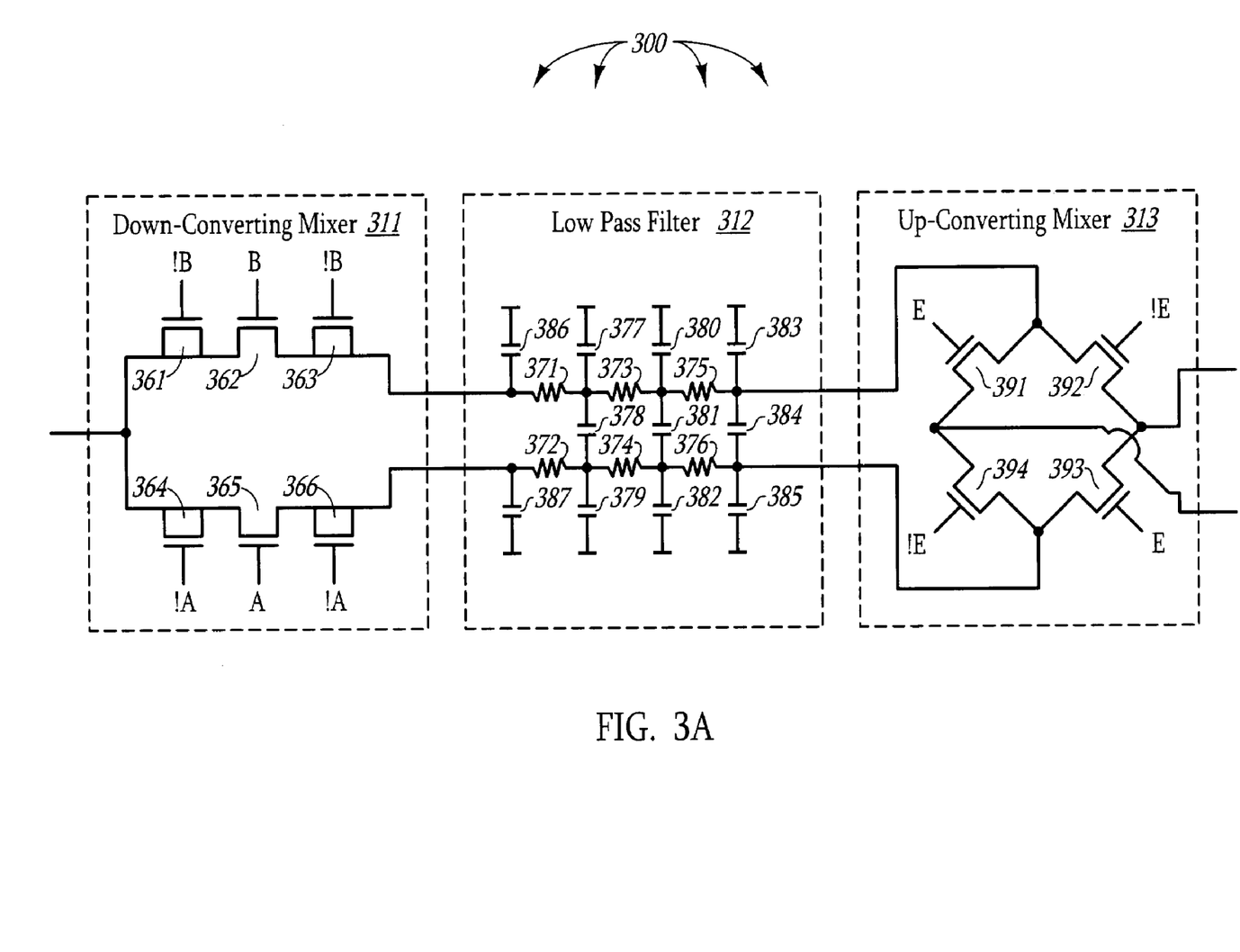
FIG. 3A illustrates a component-level circuit diagram showing further details of an embodiment of the down-converting mixer, a low pass filter, and an up-converting mixer that may be used in the circuit of FIG. 1 as passive elements.

FIG. 3A illustrates a specific embodiment 300 of an interconnected down-converting mixer 311, low pass filter 312, and up-converting mixer 313, which may be examples of down-converting mixer 211, low pass filter 212, and up-converting mixer 213, respectively, of FIG. 2.

The down-converting mixer 311 has one input terminal and two output terminals. Field-effect transistors 361 through 363 are coupled with their channel regions in series between the input terminal and the upper output terminal of the down-converting mixer 311. Field-effect transistors 364 through 366 are coupled with their channel regions in series between the input terminal and the low output terminal of the down-converting mixer 311. Field effect transistors 361, 363, 364 and 366 have their source and drain connections shorted. To minimize charge injection while accomplishing down-conversion, down->converting control signal A is applied at the gate terminal of field-effect transistor 365, while down-converting control signal !A is applied at the gate terminal of field-effect transistors 364 and 366. Similarly, down-converting control signal B is applied at the gate terminal of field-effect transistor 362, while down-converting control signal !B is applied at the gate terminal of field-effect transistors 361 and 363.

As previously mentioned, the down-converting control signals A, B, !A, and !B may be cycled at about the carrier frequency of the received signal thereby reducing (or eliminating) DC offset introduced by the down-converting mixer 311. Additionally, second-order intermodulation product introduced by the down-converting mixer 311 may be reduced by the common mode rejection properties of downstream circuitry.

The low pass filter may be any passive low pass filter that includes one or more poles. However, in the illustrated embodiment, filter 312 is a resistor-capacitor circuit that has a low pass frequency response for each of the two differential input signals. As will be apparent to those or ordinary skill in the art, the resistor-capacitor circuit has a frequency response that includes four poles. The low pass filter 312 may include resistors 371 through 376 and capacitors 377 through 387 configured as shown in FIG. 3A. By designing these resistor and capacitors with appropriate values, the position of those poles may be adjusted. In one embodiment, in order to obtain a high roll-off for better selectivity of the passed signal, the four poles are adjusted to be coincident so as to have an 80 dB/decade roll-off. The low pass filter 312 is a passive element and thus does not introduce new DC offset or 1/f noise into the signal, thereby preserving dynamic range.

The up-converting mixer 313 includes two input terminals, two output terminals, and four field-effect transistors 391 through 394. The field-effect transistor 391 has its channel region coupled between the upper input terminal and the lower output terminal of the up-converting mixer 313 and is controlled at its gate terminal by up-converting control signal E. The field-effect transistor 392 has its channel region coupled between the upper input terminal and the upper output terminal of the up-converting mixer 313 and is controlled at its gate terminal by up-converting control signal !E. The field-effect transistor 393 has its channel region coupled between the lower input terminal and the upper output terminal of the up-converting mixer 313 and is controlled at its gate terminal by up-converting control signal E. The field-effect transistor 394 has its channel region coupled between the lower input terminal and the lower output terminal of the up-converting mixer 313 and is controlled at its gate terminal by up-converting control signal !E.

Figure 3B:
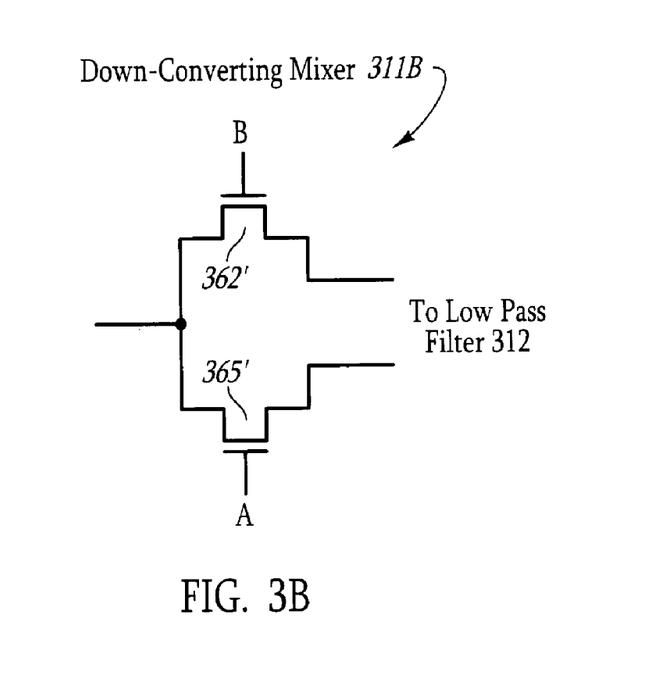
FIG. 3B illustrates a component-level circuit diagram showing an alternative structure for the down-converting mixer.

FIG. 3B illustrates an alternative embodiment of the down-converting mixer 311 in the form of down-converting mixer 311B. The down-converting mixer 311B is similar to the down-converting mixer 311, except that the field effect transistors 361, 363, 364 and 366 are not present, and field effect transistors 362' and 365' replace transistors 362 and 365.

Figure 3C:
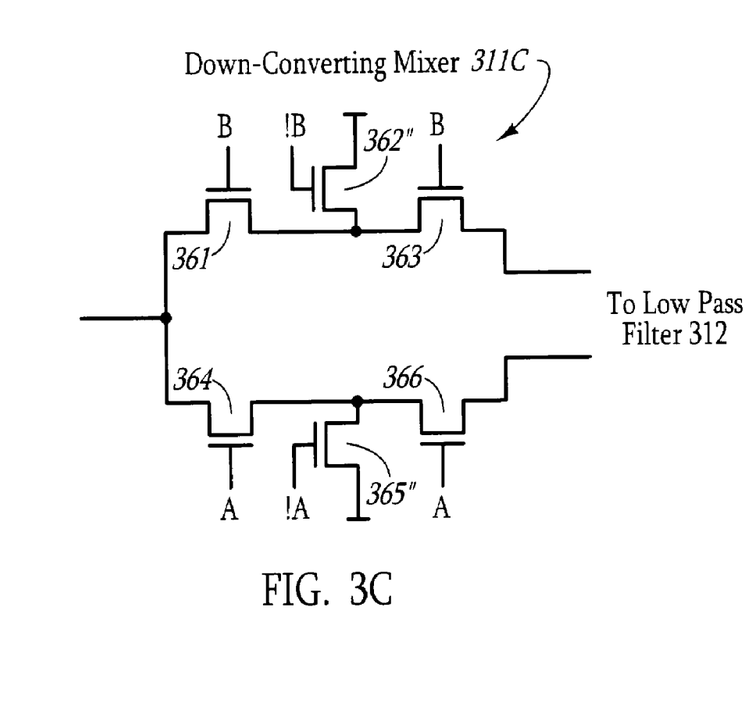
FIG. 3C illustrates a component-level circuit diagram showing a second alternative structure for the down-converting mixer.

FIG. 3C illustrates a second alternative embodiment of the down-converting mixer 311 in the form of down-converting mixer 311C. The down-converting mixer 311C is similar to the down-converting mixer 311, except that the field effect transistors 362" and 365" replace transistors 362 and 365.

Figure 4:
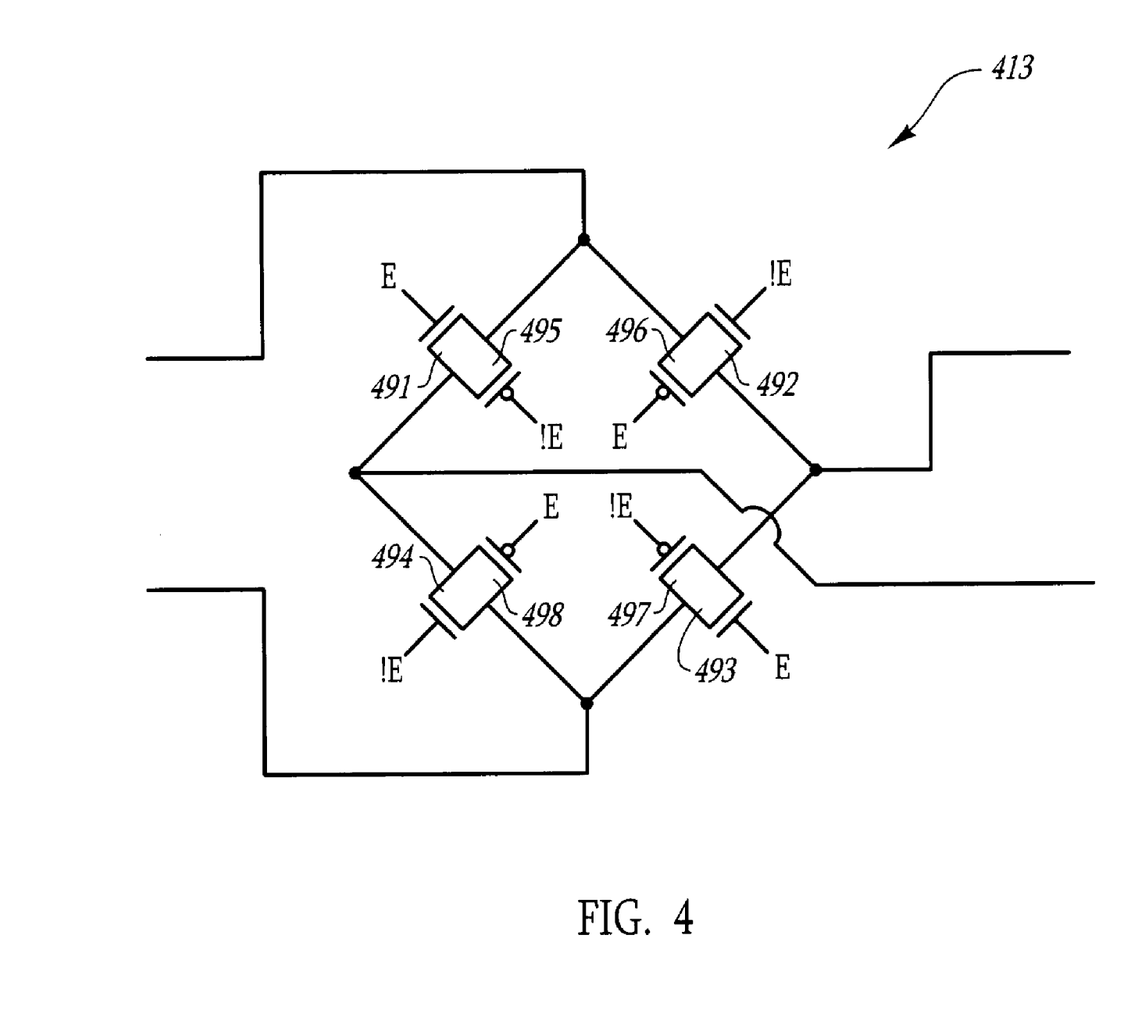
FIG. 4 illustrates a component-level circuit diagram showing further details of another embodiment of an up-converting mixer that may be used in the circuit of FIG. 1 as a passive element.

FIG. 4 illustrates an alternative structure 413 for the up-converting mixer 213. The up-converting mixer 413 includes field-effect transistors 491 through 494 which are configured the same as described above for respective transistors 391 through 394 in up-converting mixer 313. Additionally, the up-converting mixer 413 includes field-effect transistors 495 through 498 that have an opposite polarity as compared to respective field-effect transistors 491 through 494. For example, if field-effect transistors 491 through 494 are n-type field effect transistors as in the illustrated example, the field-effect transistors 495 through 498 would be p-type field effect transistors, and vice versa. Each of the field-effect transistors 495 through 498 are coupled between respective input terminals and respective output terminals as described above for corresponding field-effect transistors 391 through 394. In order to maximize dynamic range, the dc offsets at the input and output terminals of the up-converting mixer 413 should all be midway between the supply voltages Vdd and Vss.

Figure 5:
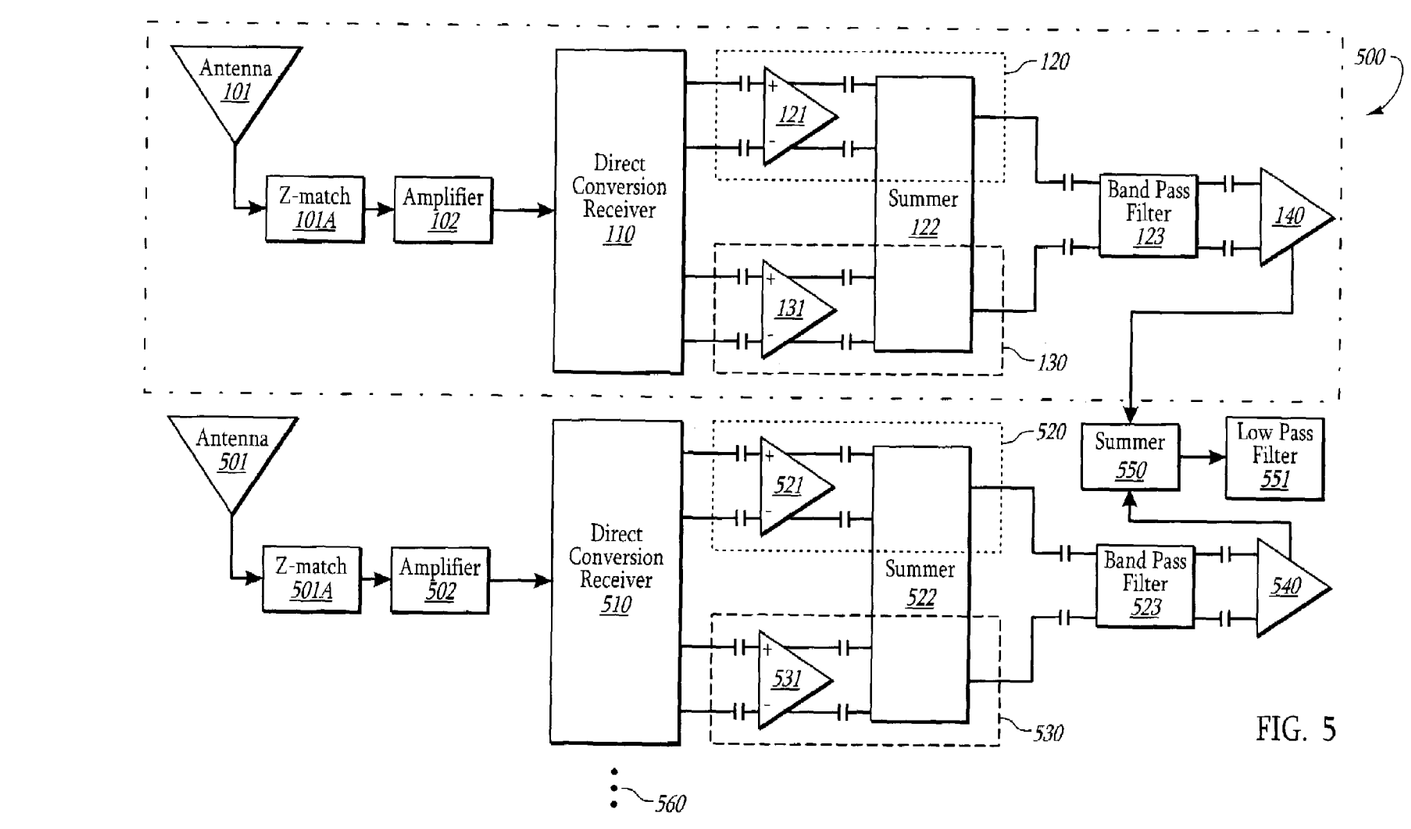
FIG. 5 illustrates a schematic diagram of a diversity receiver circuit that detects baseband amplitude and which uses multiple copies of the circuitry of FIG. 1.

FIG. 5 illustrates an diversity receiver circuit 500 in which two receivers such as the one illustrated and described with respect to FIG. 1 may be used to obtain advantages associated with antenna diversity. Antenna diversity involves the user of more than one antenna to receive a signal to improve the ability to properly receive the signal. When using one antenna to receive a signal, the signal may have actually taken several paths from the transmitter to the receiver, each having a different length. This causes an echo effect that might actually lead to destructive interference between the signals received from different paths. The use of two or more antennas that are appropriately spaced reduces the degradation due to the echo effect since the echo at one antenna will typically be different than the echo at another, thereby reducing the likelihood that the echo would degrade the signal.

The circuit enclosed by the intermittent dashed/dotted box has the same structure as described above for FIG. 1. The Received Signal Strength Indicator (RSSI) output by the log amplifier 140 is provided to a summer 550. The summer 550 also receives the RSSI output from a second receiver circuit. The second receiver circuit includes various elements 501, 501A, 502, 510, 520, 521, 522, 523, 530, 531 and 540, which may be similarly structured and interconnected as the corresponding elements 101, 101A, 102, 110, 120, 121, 122, 123, 130, 131 and 140 described above with respect to FIG. 1. The summer 550 may also receive such RSSI indicators for other receivers as well as represented by the vertical ellipses 560, thereby providing for even more diversity advantage.

All of the structures described above as being associated with the diversity receiver circuit 500 may be fabricated using CMOS processes. Accordingly, the diversity receiver circuit 500 may be fabricated on a single die. Furthermore, the receiver circuit 100 and diversity receiver circuit 500 has a good dynamic range and sensitivity with relatively low power requirements. Also, by using up-conversion after down-conversion of the baseband signal, DC offset, DC drift and 1/f noise may be substantially reduced.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A receiver circuit comprising the following:
   a first direct conversion receiver configured to generate a first in-phase differential signal and a first quadrature-phase differential signal that are at least derived from a baseband signal;
   a first in-phase amplifier configured to receive and amplify the first in-phase differential signal;
   a first in-phase summer configured to receive and sum the amplified first in-phase differential signal;
   a first quadrature-phase amplifier configured to receive and amplify the first quadrature-phase differential signal;
   a first quadrature-phase summer configured to receive and sum the amplified first quadrature-phase differential signal, the summed first in-phase signal and the summed first quadrature-phase signal representing a first differential baseband-derived signal;
   a first log amplifier configured to receive the first differential baseband-derived signal and generate a signal that is approximately proportional to a log of the amplitude of the first differential baseband-derived signal;
   a second direct conversion receiver configured to generate a second in-phase differential signal and a second quadrature-phase differential signal that are at least derived from a baseband signal;
   a second in-phase amplifier configured to receive and amplify the second in-phase differential signal;
   a second in-phase summer configured to receive and sum the amplified second in-phase differential signal;
   a second quadrature-phase amplifier configured to receive and amplify the second quadrature-phase differential signal;
   a second quadrature-phase summer configured to receive and sum the amplified second quadrature-phase differential signal, the summed second in-phase signal and the summed second quadrature-phase signal representing a second differential baseband-derived signal;
   a second log amplifier configured to receive the second differential baseband-derived signal and generate a signal that is approximately proportional to a log of the amplitude of the second differential baseband-derived signal; and
   an amplitude summer configured to receive and sum the first and second differential baseband-derived signals.

2. A receiver circuit in accordance with claim 1, wherein each element of the receiver circuit is structured on a single integrated circuit.

3. A receiver circuit in accordance with claim 1, further comprising the following:

a low pass filter configured to receive and filter the summed differential baseband-derived signal.

4. A receiver circuit comprising the following:
a direct conversion receiver configured to generate an in-phase differential signal and a quadrature-phase differential signal that are at least derived from a baseband signal;
an in-phase amplifier configured to receive and amplify the in-phase differential signal;
an in-phase summer configured to receive and sum the amplified in-phase differential signal;
a quadrature-phase amplifier configured to receive and amplify the quadrature-phase differential signal;
a quadrature-phase summer configured to receive and sum the amplified quadrature-phase differential signal, the summed in-phase signal and the summed quadrature-phase signal representing a differential baseband-derived signal; and
a log amplifier configured to receive the differential baseband-derived signal and generate a signal that is approximately proportional to a log of the amplitude of the differential baseband-derived signal,
wherein the wherein the direct conversion receiver comprises the following:
an in-phase down-converting mixer that is configured to down-convert a received modulated signal to thereby generate an in-phase portion of a baseband signal;
an in-phase low pass filter that is coupled to the in-phase down-converting mixer so as to filter high frequency components of the in-phase down-converted signal to thereby generate an in-phase filtered down-converted signal;
an in-phase up-converting mixer that is coupled to the in-phase low pass filter so as to receive and up-convert the in-phase filtered down-converted signal to generate the in-phase differential signal, wherein there are no active components that operate on the in-phase down-converted signal prior to being up-converted;
a quadrature-phase down-converting mixer that is configured to down-convert the received modulated signal to thereby generate a quadrature-phase portion of the baseband signal;
a quadrature-phase low pass filter that is coupled to the quadrature-phase down-converting mixer so as to filter high frequency components of the quadrature-phase down-converted signal to thereby generate a quadrature-phase down-converted signal;
a quadrature-phase up-converting mixer that is coupled to the quadrature-phase low pass filter so as to receive and up-convert the quadrature-phase filtered down-converted signal to generate the quadrature-phase differential signal, wherein there are no active components that operate on the quadrature-phase down-converted signal prior to being up-converted;
a down-converting local oscillator that is configured to generate a first down-conversion control signal, a second down-conversion control signal that is approximately 180 degrees out of phase with the first down-conversion control signal, a third down-conversion control signal that represents a binary complement of the first down-conversion control signal, and a fourth down-conversion control signal that represents a binary complement of the second down-conversion control signal, wherein the in-phase down-converting mixer comprises the following:
an input terminal and first and second output terminals;
first, second, and third field-effect transistors coupled in series between the input terminal of the in-phase down-converting mixer and the first output terminal of the in-phase down-converting mixer, the first, second, and third field-effect transistors coupled to the down-converting local oscillator such that the first down-converting control signal is applied to a gate terminal of the second field-effect transistor, and such that the third down-converting control signal is applied to a gate terminal of the first and third field-effect transistors; and
fourth, fifth, and sixth field-effect transistors coupled in series between the input terminal of the in-phase down-converting mixer and the second output terminal of the in-phase down-converting mixer, the fourth, fifth, and sixth field-effect transistors coupled to the down-converting local oscillator such that the second down-converting control signal is applied to a gate terminal of the fifth field-effect transistor, and such that the fourth down-converting control signal is applied to a gate terminal of the fourth and sixth field-effect transistors.

5. A receiver circuit in accordance with claim 4, further comprising an up-converting local oscillator that is configured to generate a first up-conversion control signal and a second up-conversion control signal that represents a binary complement of the first up-conversion control signal, wherein the in-phase up-converting mixer comprises the following:
a first and second input terminal and first and second output terminals;
a seventh field-effect transistor having a source or drain terminal coupled to the first output terminal of the in-phase down-converting mixer so as to receive at least a filtered version of the signal provided on the first output terminal of the in-phase down-converting mixer, the other of the source or drain terminal of the seventh field-effect transistor coupled to the first output terminal of the in-phase up-converting mixer, a gate terminal of the seventh field-effect transistor configured to receive the second up-converting control signal;
an eighth field-effect transistor having a source or drain terminal coupled to the first output terminal of the in-phase down-converting mixer so as to receive at least a filtered version of the signal provided on the first output terminal of the in-phase down-converting mixer, the other of the source or drain terminal of the eighth field-effect transistor coupled to the second output terminal of the in-phase up-converting mixer, a gate terminal of the eighth field-effect transistor configured to receive the first up-converting control signal;
a ninth field-effect transistor having a source or drain terminal coupled to the second output terminal of the in-phase down-converting mixer so as to receive at least a filtered version of the signal provided on the second output terminal of the in-phase down-converting mixer, the other of the source or drain terminal of the ninth field-effect transistor coupled to the first output terminal of the in-phase up-converting mixer, a gate terminal of the ninth field-effect transistor configured to receive the first up-converting control signal;

a tenth field-effect transistor having a source or drain terminal coupled to the second output terminal of the in-phase down-converting mixer so as to receive at least a filtered version of the signal provided on the second output terminal of the in-phase down-converting mixer, the other of the source or drain terminal of the tenth field-effect transistor coupled to the second output terminal of the in-phase up-converting mixer, a gate terminal of the tenth field-effect transistor configured to receive the second up-converting control signal.

6. A receiver circuit comprising the following:

a direct conversion receiver configured to generate an in-phase differential signal and a quadrature-phase differential signal that are at least derived from a baseband signal;

an in-phase amplifier configured to receive and amplify the in-phase differential signal;

an in-phase summer configured to receive and sum the amplified in-phase differential signal;

a quadrature-phase amplifier configured to receive and amplify the quadrature-phase differential signal;

a quadrature-phase summer configured to receive and sum the amplified quadrature-phase differential signal, the summed in-phase signal and the summed quadrature-phase signal representing a differential baseband-derived signal; and a log amplifier configured to receive the differential baseband-derived signal and generate a signal that is approximately proportional to a log of the amplitude of the differential baseband-derived signal, wherein the wherein the direct conversion receiver comprises the following:

an in-phase down-converting mixer that is configured to down-convert a received modulated signal to thereby generate an in-phase portion of a baseband signal;

an in-phase low pass filter that is coupled to the in-phase down-converting mixer so as to filter high frequency components of the in-phase down-converted signal to thereby generate an in-phase filtered down-converted signal;

an in-phase up-converting mixer that is coupled to the in-phase low pass filter so as to receive and up-convert the in-phase filtered down-converted signal to generate the in-phase differential signal, wherein there are no active components that operate on the in-phase down-converted signal prior to being up-converted;

a quadrature-phase down-converting mixer that is configured to down-convert the received modulated signal to thereby generate a quadrature-phase portion of the baseband signal;

a quadrature-phase low pass filter that is coupled to the quadrature-phase down-converting mixer so as to filter high frequency components of the quadrature-phase down-converted signal to thereby generate a quadrature-phase down-converted signal;

a quadrature-phase up-converting mixer that is coupled to the quadrature-phase low pass filter so as to receive and up-convert the quadrature-phase filtered down-converted signal to generate the quadrature-phase differential signal, wherein there are no active components that operate on the quadrature-phase down-converted signal prior to being up-converted;

an up-converting local oscillator that is configured to generate a first up-conversion control signal and a second up-conversion control signal that represents a binary complement of the first up-conversion control signal, wherein the in-phase up-converting mixer comprises the following:

a first and second input terminal and first and second output terminals;

a first field-effect transistor having a source or drain terminal coupled to a first output terminal of the in-phase down-converting mixer so as to receive at least a filtered version of the signal provided on the first output terminal of the in-phase down-converting mixer, the other of the source or drain terminal of the first field-effect transistor coupled to the first output terminal of the in-phase up-converting mixer, a gate terminal of the first field-effect transistor configured to receive the second up-converting control signal;

a second field-effect transistor having a source or drain terminal coupled to the first output terminal of the in-phase down-converting mixer so as to receive at least a filtered version of the signal provided on the first output terminal of the in-phase down-converting mixer, the other of the source or drain terminal of the second field-effect transistor coupled to the second output terminal of the in-phase up-converting mixer, a gate terminal of the second field-effect transistor configured to receive the first up-converting control signal;

a third field-effect transistor having a source or drain terminal coupled to a second output terminal of the in-phase down-converting mixer so as to receive at least a filtered version of the signal provided on the second output terminal of the in-phase down-converting mixer, the other of the source or drain terminal of the third field-effect transistor coupled to the first output terminal of the in-phase up-converting mixer, a gate terminal of the third field-effect transistor configured to receive the first up-converting control signal; and a fourth field-effect transistor having a source or drain terminal coupled to the second output terminal of the in-phase down-converting mixer so as to receive at least a filtered version of the signal provided on the second output terminal of the in-phase down-converting mixer, the other of the source or drain terminal of the fourth field-effect transistor coupled to the second output terminal of the in-phase up-converting mixer, a gate terminal of the fourth field-effect transistor configured to receive the second up-converting control signal.

7. A receiver circuit in accordance with claim 6, wherein the first, second, third and fourth field-effect transistors are each nMOSFETs, wherein the in-phase up-converting mixer further comprises the following:

a first p-type field-effect transistor having a source or drain terminal coupled to the first output terminal of the in-phase down-converting mixer so as to receive at least a filtered version of the signal provided on the first output terminal of the in-phase down-converting mixer, the other of the source or drain terminal of the first p-type field-effect transistor coupled to the first output terminal of the in-phase up-converting mixer, a gate terminal of the first p-type field-effect transistor configured to receive the first up-converting control signal;

a second p-type field-effect transistor having a source or drain terminal coupled to the first output terminal of the in-phase down-converting mixer so as to receive at least a filtered version of the signal provided on the first output terminal of the in-phase down-converting mixer, the other of the source or drain terminal of the second p-type field-effect transistor coupled to the second output terminal of the in-phase up-converting mixer, a gate terminal of the second p-type field-effect transistor configured to receive the second up-converting control signal;

a third p-type field-effect transistor having a source or drain terminal coupled to the second output terminal of the in-phase down-converting mixer so as to receive at least a filtered version of the signal provided on the second output terminal of the in-phase down-converting mixer, the other of the source or drain terminal of the third p-type field-effect transistor coupled to the first output terminal of the in-phase up-converting mixer, a gate terminal of the third p-type field-effect transistor configured to receive the second up-converting control signal; and a fourth p-type field-effect transistor having a source or drain terminal coupled to the second output terminal of the in-phase down-converting mixer so as to receive at least a filtered version of the signal provided on the second output terminal of the in-phase down-converting mixer, the other of the source or drain terminal of the fourth p-type field-effect transistor coupled to the second output terminal of the in-phase up-converting mixer, a gate terminal of the fourth p-type field-effect transistor configured to receive the first up-converting control signal.

8. A receiver circuit in accordance with claim 6, wherein the in-phase low pass filter comprises a resister-capacitor circuit having at least one pole.

9. A receiver circuit in accordance with claim 6, wherein the in-phase low pass filter comprises a resister-capacitor circuit having four poles.

10. A receiver circuit in accordance with claim 6, wherein the first output terminal of the in-phase up-converting mixer is capacitively coupled to a first input terminal of the in-phase amplifier, the second output terminal of the in-phase up-converting mixer being capacitively coupled to a second input terminal of the in-phase amplifier.

11. A receiver circuit in accordance with claim 10, wherein a first output terminal of the in-phase amplifier is capacitively coupled to a first input terminal of the first in-phase summer.

12. A receiver circuit comprising the following:
a direct conversion receiver configured to generate an in-phase differential signal and a quadrature-phase differential signal that are at least derived from a baseband signal;
an in-phase amplifier configured to receive and amplify the in-phase differential signal;
an in-phase summer configured to receive and sum the amplified in-phase differential signal;
a quadrature-phase amplifier configured to receive and amplify the quadrature-phase differential signal;
a quadrature-phase summer configured to receive and sum the amplified quadrature-phase differential signal, the summed in-phase signal and the summed quadrature-phase signal representing a differential baseband-derived signal; and
a log amplifier configured to receive the differential baseband-derived signal and generate a signal that is approximately proportional to a log of the amplitude of the differential baseband-derived signal, wherein the wherein the direct conversion receiver comprises the following:
an in-phase down-converting mixer that is configured to down-convert a received modulated signal to thereby generate an in-phase portion of a baseband signal;
an in-phase low pass filter that is coupled to the in-phase down-converting mixer so as to filter high frequency components of the in-phase down-converted signal to thereby generate an in-phase filtered down-converted signal;
an in-phase up-converting mixer that is coupled to the in-phase low pass filter so as to receive and up-convert the in-phase filtered down-converted signal to generate the in-phase differential signal, wherein there are no active components that operate on the in-phase down-converted signal prior to being up-converted;
a quadrature-phase down-converting mixer that is configured to down-convert the received modulated signal to thereby generate a quadrature-phase portion of the baseband signal;
a quadrature-phase low pass filter that is coupled to the quadrature-phase down-converting mixer so as to filter high frequency components of the quadrature-phase down-converted signal to thereby generate a quadrature-phase down-converted signal; and
a quadrature-phase up-converting mixer that is coupled to the quadrature-phase low pass filter so as to receive and up-convert the quadrature-phase filtered down-converted signal to generate the quadrature-phase differential signal, wherein there are no active components that operate on the quadrature-phase down-converted signal prior to being up-converted;
wherein the first output terminal of the in-phase up-converting mixer is capacitively coupled to a first input terminal of the in-phase amplifier, the second output terminal of the in-phase up-converting mixer being capacitively coupled to a second input terminal of the in-phase amplifier.

13. A receiver circuit in accordance with claim 12, wherein a first output terminal of the in-phase amplifier is capacitively coupled to a first input terminal of the first in-phase summer.

14. A receiver circuit comprising the following:
a first direct conversion receiver configured to generate a first in-phase differential signal and a first quadrature-phase differential signal that are at least derived from a baseband signal;
a first in-phase amplifier configured to receive and amplify the first in-phase differential signal;
a first in-phase summer configured to receive and sum the amplified first in-phase differential signal;
a first quadrature-phase amplifier configured to receive and amplify the first quadrature-phase differential signal;
a first quadrature-phase summer configured to receive and sum the amplified first quadrature-phase differential signal, the summed first in-phase signal and the summed first quadrature-phase signal representing a first differential baseband-derived signal;
a first log amplifier configured to receive the first differential baseband-derived signal and generate a signal that is approximately proportional to a log of the amplitude of the first differential baseband-derived signal, wherein the first direct conversion receiver comprises the following:
- a first in-phase down-converting mixer that is configured to down-convert a received modulated signal to thereby generate a first in-phase portion of a baseband signal;
- a first in-phase low pass filter that is coupled to the first in-phase down-converting mixer so as to filter high frequency components of the first in-phase down-converted signal to thereby generate a first in-phase filtered down-converted signal;
- a first in-phase up-converting mixer that is coupled to the first in-phase low pass filter so as to receive and up-convert the first in-phase filtered down-converted signal to generate the in-phase differential signal, wherein there are no active components that operate on the in-phase down-converted signal prior to being up-converted;
- a first quadrature-phase down-converting mixer that is configured to down-convert the received modulated signal to thereby generate a quadrature-phase portion of the baseband signal;
- a first quadrature-phase low pass filter that is coupled to the first quadrature-phase down-converting mixer so as to filter high frequency components of the first quadrature-phase down-converted signal to thereby generate a first quadrature-phase down-converted signal;
- a first quadrature-phase up-converting mixer that is coupled to the first quadrature-phase low pass filter so as to receive and up-convert the first quadrature-phase filtered down-converted signal to generate the first quadrature-phase differential signal wherein there are no active components that operate on the first quadrature-phase down-converted signal prior to being up-converted;
- a second direct conversion receiver configured to generate a second in-phase differential signal and a second quadrature-phase differential signal that are at least derived from the baseband signal;
- a second in-phase amplifier configured to receive and amplify the second in-phase differential signal;
- a second in-phase summer configured to receive and sum the amplified first in-phase differential signal;
- a second quadrature-phase amplifier configured to receive and amplify the second quadrature-phase differential signal;
- a second quadrature-phase summer configured to receive and sum the amplified second quadrature-phase differential signal, the summed second in-phase signal and the summed second quadrature-phase signal representing a second differential baseband-derived signal;
- a second log amplifier configured to receive the second differential baseband-derived signal and generate a signal that is approximately proportional to a log of the amplitude of the second differential baseband-derived signal; and
- an amplitude summer configured to receive and sum the first and second differential baseband-derived signals.

\* \* \* \* \*

UNITED STATES PATENT AND TRADEMARK OFFICE
CERTIFICATE OF CORRECTION

PATENT NO. : 7,113,760 B2
APPLICATION NO. : 10/426383
DATED : September 26, 2006
INVENTOR(S) : Petrov et al.

It is certified that error appears in the above-identified patent and that said Letters Patent is hereby corrected as shown below:

Column 1
Line 23, change "extracts" to --extract--

Column 5
Line 4, change "or" to --of--
Line 15, change "terms" to --term--
Line 62, change "132" to --122--
Line 63, change "132" to --122--

Column 6
Line 21, change "Thus" to --This--

Column 7
Line 55, change "223" to --221--

Column 8
Line 19, change "down->converting" to --down-converting--
Line 39, change "or" to --of--

Column 9
Line 40, change "user" to --use--

Column 11
Line 23, before "wherein the", remove "wherein the"

Column 13
Line 33, before "wherein the", remove "wherein the"

UNITED STATES PATENT AND TRADEMARK OFFICE
CERTIFICATE OF CORRECTION

PATENT NO. : 7,113,760 B2 Page 2 of 2
APPLICATION NO. : 10/426383
DATED : September 26, 2006
INVENTOR(S) : Petrov et al.

It is certified that error appears in the above-identified patent and that said Letters Patent is hereby corrected as shown below:

<u>Column 16</u>
Line 1, before "wherein the", remove "wherein the"

Signed and Sealed this

Seventeenth Day of April, 2007

JON W. DUDAS
*Director of the United States Patent and Trademark Office*